US007413484B2

(12) United States Patent
Fedder et al.

(10) Patent No.: US 7,413,484 B2
(45) Date of Patent: Aug. 19, 2008

(54) ELECTRICAL TERMINAL HAVING A COMPLIANT RETENTION SECTION

(75) Inventors: James L. Fedder, Etters, PA (US); Attalee S. Taylor, Palmyra, PA (US); David A. Trout, Lancaster, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/462,012

(22) Filed: Aug. 2, 2006

(65) Prior Publication Data
US 2008/0032568 A1 Feb. 7, 2008

(51) Int. Cl.
*H01R 13/42* (2006.01)

(52) U.S. Cl. ....................................... 439/751

(58) Field of Classification Search ................ 439/751, 439/82, 873
See application file for complete search history.

(56) References Cited

U.S. PATENT DOCUMENTS

| 4,186,982 | A |   | 2/1980  | Cobaugh et al. |
|-----------|---|---|---------|----------------|
| 4,513,499 | A | * | 4/1985  | Roldan ........................ 29/874 |
| 4,606,589 | A | * | 8/1986  | Elsbree et al. ................ 439/78 |
| 4,737,114 | A | * | 4/1988  | Yaegashi ..................... 439/82 |
| 4,763,408 | A | * | 8/1988  | Heisey et al. ................ 29/874 |
| 4,774,763 | A |   | 10/1988 | Palecek et al. |
| 4,784,620 | A | * | 11/1988 | Tanaka ....................... 439/751 |
| 4,846,727 | A |   | 7/1989  | Glover et al. |
| 4,857,018 | A |   | 8/1989  | Pickles |
| 5,104,341 | A |   | 4/1992  | Gilissen et al. |
| 5,286,212 | A |   | 2/1994  | Broeksteeg |
| 5,342,211 | A |   | 8/1994  | Broeksteeg |
| 5,664,970 | A |   | 9/1997  | Millhimes et al. |
| 5,893,779 | A |   | 4/1999  | Bianca et al. |
| 5,944,538 | A |   | 8/1999  | Sorig |
| 5,944,563 | A |   | 8/1999  | Nagafuji |
| 6,077,128 | A |   | 6/2000  | Maag et al. |

(Continued)

FOREIGN PATENT DOCUMENTS

EP         0 134 094      3/1985
EP         0205461 B1     6/1989

OTHER PUBLICATIONS

"L' Insertion a Force Dans les Circuits Imprimes" Toute L'Electronique, Societe des Editions Radio. Paris, FR, No. 551, Feb. 1, 1990, pp. 34-37, XP000095549.
International Search Report, International application No. PCT/US2007/016904, International filing date Jul. 27, 2007.
Tyco Electronics Drawing No. C-106015, Dec. 15, 1997, 3 pages.
Tyco Electronics Drawing No. C 1393755-2, Apr. 15, 1998, 1 page.

(Continued)

*Primary Examiner*—Tulsidas C. Patel
*Assistant Examiner*—Phuong Nguyen

(57) ABSTRACT

An electrical terminal of the type to be inserted into an aperture of an electrical panel member is provided. The electrical terminal includes a base and an insertion portion extending from the base to a first end. A slit formed through the insertion portion and extending from or between the base and between the first end defines a compliant portion having a first leg and a second leg. A substantially central axis extends between opposite ends of the slit so that a segment of the first leg is deformed in one direction away from the axis, while a segment of the second leg is deformed in a direction away from the axis opposite the first leg. The deformed first leg segment and the deformed second leg segment are offset from the center of the slit.

14 Claims, 5 Drawing Sheets

U.S. PATENT DOCUMENTS

| | | | |
|---|---|---|---|
| 6,129,592 | A | 10/2000 | Mickievicz et al. |
| 6,379,188 | B1 | 4/2002 | Cohen et al. |
| 6,471,548 | B2 | 10/2002 | Bertoncini et al. |
| 6,572,410 | B1 | 6/2003 | Volstorf et al. |
| 7,008,272 | B2 | 3/2006 | Blossfeld |
| 2002/0195271 | A1 | 12/2002 | Gailus |
| 2006/0035535 | A1 | 2/2006 | Kawahara et al. |
| 2006/0246786 | A1 | 11/2006 | Noguchi |

OTHER PUBLICATIONS

Photographs depicting pin configuration used in connector such as that depicted in Tyco Electronics Drawing No. C 1393755-2, 1 page, no date available.

Sample corresponding to concurrently submitted photographs depicting pin configuration used in connector such as that depicted in Tyco Electronics Drawing No. C 1393755-2, no date available.

* cited by examiner

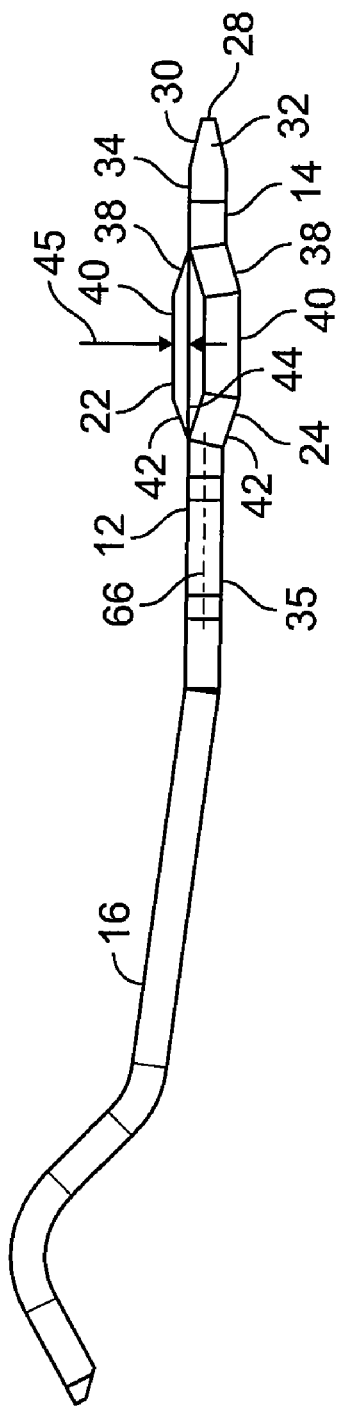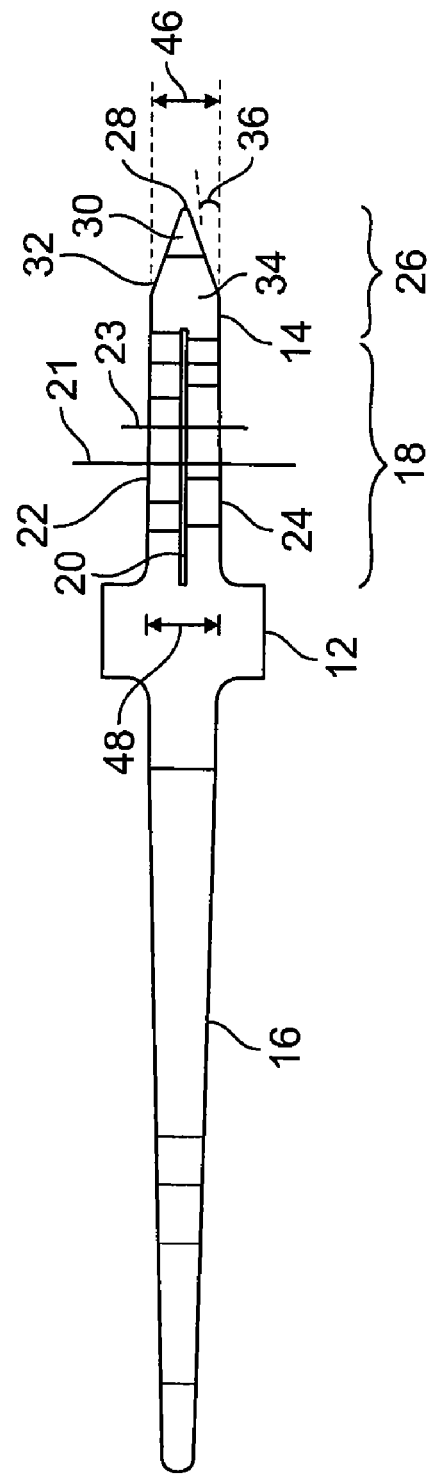
FIG. 2
FIG. 3

ELECTRICAL TERMINAL HAVING A COMPLIANT RETENTION SECTION

FIELD OF THE INVENTION

The present invention is directed to an electrical terminal of the type to be inserted into an aperture of an electrical panel member.

BACKGROUND OF THE INVENTION

Electrical terminals having compliant retention sections for mechanical engagement and electrical connection are commonly used with plated through-apertures in printed, etched or multilayer panel members, also referred to as circuit boards. Due to the increasing complexity of electronic components, it is desirable to fit more components in less space on the panel members. Consequently, the size of the electrical terminals and spacing between them has been reduced, while the number of electrical terminals housed in connectors for connection with panel members has increased.

There are drawbacks associated with the use of increased numbers of electrical terminals in reduced areas of panel members. One drawback is the high level of force required to urge the electrical terminals into initial engagement with their respective apertures in the panel members, which can damage both the panel members and the electrical terminals. However, with conventional constructions of electrical terminals, reducing the magnitude of insertion forces also threatens to reduce the quality of the electrical connection between the electrical terminal and the panel member aperture.

What is needed is an electrical terminal having a reduced initial engagement force associated with mounting in a panel member, while providing an improved electrical connection with the panel member.

SUMMARY OF THE INVENTION

The present invention relates to an electrical terminal of the type to be inserted into an aperture of an electrical panel member. The electrical terminal includes a base. An insertion portion extends from the base to a first end. A slit formed through the insertion portion and extending from or between the base and between the first end defines a compliant portion having a first leg and a second leg. A substantially central axis extends between opposite ends of the slit. A segment of the first leg is deformed in one direction away from the slit. A segment of the second leg is deformed in a direction away from the slit opposite the first leg. The deformed first leg segment and the deformed second leg segment are offset from the center of the slit.

The present invention further relates to an electrical terminal of the type to be inserted into an aperture of an electrical panel member. The electrical terminal includes a base and an insertion portion extending from the base to a first end. The insertion portion has a first tapered segment adjacent the first end and a second tapered segment extending between the first tapered segment and the base.

The present invention yet further relates to an electrical terminal of the type to be inserted into an aperture of an electrical panel member. The electrical connector includes a base and an insertion portion that extends from the base to a first end. A slit formed through the insertion portion and extending from or between the base and between the first end defines a compliant portion having a first leg and a second leg. A substantially central axis extends between opposite ends of the slit. A segment of the first leg is deformed in one direction away from the axis. A segment of the second leg is deformed in a direction away from the axis opposite the first leg, the deformed first leg segment and the deformed second leg segment being offset from the center of the slit. A first tapered segment is adjacent the first end and a second tapered segment extends between the first tapered segment and the base. The insertion portion is configured for insertion into an aperture of less than 0.016 inch.

An advantage of the present invention is that the insertion force associated with mounting a component in a panel member is reduced.

An additional advantage of the present invention is that the insertion force associated with mounting a component in a panel member is substantially constant over the length of travel of the mounting hardware in the panel member.

A further advantage of the present invention is that electrical connections with a panel member are improved.

A yet further advantage of the present invention is that electrical performance of the electrical connections between panel members and associated components are improved.

A still yet further advantage of the present invention is that the electrical terminals are of reduced size, permitting an increased number of electrical terminals per unit area (terminal density).

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

FIG. 2 is a side elevation view of the electrical terminal of FIG. 1 of the present invention.

FIG. 3 is a top view of the electrical terminal of FIG. 1 of the present invention.

Wherever possible, the same reference numbers will be used throughout the drawings to refer to the same or like parts.

DETAILED DESCRIPTION OF THE INVENTION

Figure 1:
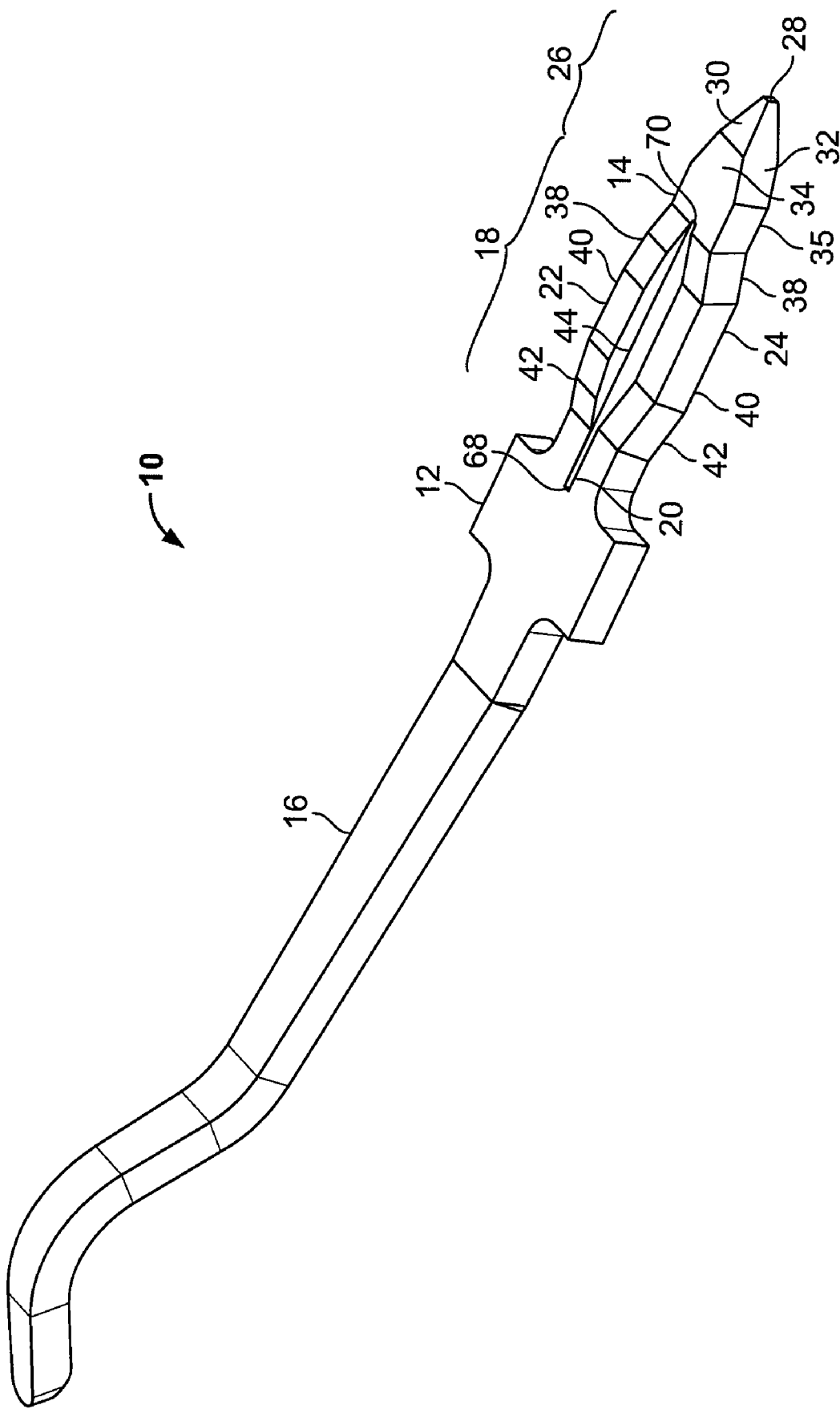
FIG. 1 is a perspective view of an electrical terminal of the present invention.

The present invention is directed to an electrical terminal 10 depicted in FIGS. 1-3. Electrical terminal 10 includes a base 12 with an insertion portion 14 extending from the base to an end 28 for insertion into a panel member or circuit board (not shown). Insertion portion 14 includes a compliant portion 18 extending to an end portion 26. Compliant portion 18 includes a slit 20, also referred to as a shear, formed in insertion portion 14. End portion 26 is disposed between compliant portion 18 and end 28 and preferably includes tapers 30, 32 formed adjacent to end 28. Extending from base 12 opposite insertion portion 14 is a beam portion 16 that extends into a connector, such as connector 50 (see FIGS. 4-6). Electrical terminal 10 can be advantageously used for insertion of insertion portions 14 into corresponding apertures in panel members of less than 0.016 inch, which apertures are preferably, but not necessarily, circular. For example, in one embodiment, a panel member having a thickness of 0.006 inch contains apertures having 0.009 inch diameters. In addition, as a general matter, as the thickness of the panel members decrease, the size of the apertures formed in the panel members also decreases.

Electrical terminal 10 can be formed from a sheet of suitable material preferably having a thickness of 0.006 inch or less, having an upper surface 34 and a lower surface 35. Suitable materials include, but are not limited to metals and/or alloys or other materials having sufficient electrical conductance, formability and ability to hold a formed profile. Although electrical terminal 10 is cut out, e.g., by stamping, or otherwise removed from the sheet of material, the electrical terminal retains upper and lower surfaces 34, 35 for discussion herein. A slit 20 is formed in compliant portion 18, which slit forming legs 22, 24. In one embodiment, slit 20 is formed substantially perpendicular to upper surface 34 and bisects legs 22, 24 having substantially equal cross sectional areas. The formation of slit 20 can, but does not necessarily, entail the removal of material from compliant portion 18, depending upon the manufacturing techniques employed. It is to be understood that although slit 20 is primarily formed through the insertion portion 14, slit 20 can extend from or between base 12 and between end portion 26 of insertion portion 14. In other words, slit 20 can extend into a portion of base 12.

Upon formation of slit 20, and possibly simultaneous with the formation of slit 20, respective segments or portions of legs 22, 24 are deformed in substantially opposite directions with respect to a substantially central axis 44 that extends from base 12 toward end 28, e.g., from an end 68 to end 70 of slit 20. In one embodiment, slit 20 is planar and axis 44 extends along the slit, so that axis 44 is coincident with the slit plane. However, it is to be understood that axis 44 is provided as a point of reference with respect to legs 22, 24. In other words, in their undeformed state, legs 22, 24 define a profile, and upon deforming the legs, at least portions of the legs extend outside the profile, providing the interference between the legs and a corresponding aperture formed in a panel member when the insertion portions are inserted inside the panel member aperture. Axis 44 is provided as a convenient means to convey the "profile extension" for legs 22, 24.

For example, as shown in FIG. 2, an end of leg 22 which is adjacent to end 28 or tip includes a lead-in ramp 38 or ramped portion that extends to a segment 40 which further extends to a lead-out ramp 42 or ramped portion. Proceeding from the end of lead-in ramp 38 that is adjacent to end 28 toward base 12, the distance, i.e., the perpendicular distance, between the lead-in ramp 38 and axis 44 increases. Continuing to proceed along segment 40 from the end of segment 40 that is adjacent to lead-in ramp 38 toward base 12, the distance between segment 40 and axis 44 typically continues to increase for at least a portion of the length of segment 40, reaching a maximum distance 45, the distance then decreasing for the remaining portion of the length of segment 40. Further proceeding along lead-out ramp 42 from an end of segment 40 that is adjacent to base 12 toward base 12, the distance between the lead-out ramp and axis 44 continues to decrease.

The discussion for leg 22 is the same for leg 24. In one embodiment, in which upper and lower surfaces 34, 35 are parallel, leg 24 is a mirror image of leg 22 with respect to a mid-plane 66 bisecting the thickness of the terminal between the upper and lower surfaces 34, 35.

It is also to be understood that while legs 22, 24 include a discussion of lead-in ramps 38, segments 40 and lead-out ramps 42 to define the profile of the legs, which could each be inferred to be linear segments, i.e., forming a trapezoidal profile away from upper surface 34, the profile of the legs is not intended to be limited to a trapezoidal profile. For example, any combination of lead-in ramp 38, segment 40 and lead-out ramp 42 could define a curved profile. In addition, the combination of lead-in ramp 38, segment 40 and lead-out ramp 42 could define a substantially arcuate profile.

It is further to be understood that legs 22, 24 can be, but are not limited to be, substantially symmetric with each other. In other words, in one embodiment having parallel upper and lower surfaces 34, 35, legs 22, 24 are of substantially equal size and have lead-in ramps 38, segments 40 and lead-out ramps 42 defining substantially similar profiles, albeit in opposite directions with respect to mid-plane 66 that bisects the thickness of the terminal between the upper and lower surfaces. In one embodiment, each of legs 22, 24 are of substantially rectangular cross sectional profile, although other profiles, including any combination and magnitude of curved or rounded edges can also be used.

As shown in FIG. 3, compliant portion 18 includes a taper 36. That is, a first width 46 of compliant portion 18, i.e., legs 22, 24 as measured along the end of compliant portion 18 which is adjacent to end portion 26, is less than a second width 48 of the compliant portion as measured along the end of compliant portion 18 which is adjacent to base 12. For clarity, width is measured along a line extending between side edges of the legs that is substantially perpendicular to axis 44 of compliant portion 18, i.e., from base 12 toward end 28. In one embodiment, the total amount of taper 36 is between zero and about 0.6 degrees, and in another embodiment, the total amount of taper 36 is between zero and about 0.3 degrees. For example, for a compliant portion 18 that is 0.05 inch in length, a taper of 0.6 degrees applied to only one side of the compliant portion equates to an increase in width of about 0.001 inch. Similarly, proportionally reduced tapers can be calculated for compliant portions that are less than 0.05 inch in length.

In one embodiment, taper 36 is formed on each of the opposite sides of compliant portion 18 substantially perpendicular to upper and lower surfaces 34, 35, so that each taper is about 0.6 degrees. In addition, it is to be understood that while the thickness of legs 22, 24, i.e., the distance between upper and lower surfaces 34, 35, can remain substantially constant, a secondary taper can be formed in legs 22, 24, if desired. That is, the distance between upper and lower surfaces 34, 35 can be varied between end 28 and base 12, i.e., a second taper from base 12 to end 28 decreasing in a direction from base 12 toward end 28, to supplement the effect of taper 36.

End portion 26 is disposed between end 28 and compliant portion 18. A taper 32 is formed adjacent to end 28 along opposite sides of end portion 26. In addition, a taper 30 is also formed adjacent to end 28 along upper and lower surfaces 34, 35. That is, taper 30 is oriented about 90 degrees from taper 32. In one embodiment, tapers 30, 32 are equal. By forming a double tapered end 28, tapers 30, 32 improve alignment with apertures in panel members, and also reduce sliding resistance between end portion 26 and the panel member apertures.

As shown in FIG. 3, which is a plan or overhead view of the terminal, slit 20 has a center 21 or centerline while legs 22, 24 have vertically aligned centers of curvature 23 or deformation, in instances where the deformation of legs 22, 24 or leg segments is considered to be nonlinear. Unlike the prior art, center 21 or centerline and at least one, and preferably each, center of curvature 23 or deformation are noncoincident. Stated another way, the deformed leg 22 or leg segment and the deformed leg 24 or leg segment are offset from the center 21 or centerline of slit 20. By virtue of at least this offset from the center 21 or centerline of slit 20 and center of curvature 23 or deformation, or the combination of this offset, the taper 36 in compliant portion 18, and secondary taper, if desired, as well as tapers 30, 32 formed in end portion 26, the insertion force of insertion portion 14 into an aperture of a panel member is reduced and is substantially uniform over substantially the entire length of insertion into the panel member aperture.

In addition to reduced insertion forces and substantially more uniform insertion forces, taper 36 provides improved electrical performance. One aspect of the improved electrical performance is an increased amount of surface area that is in physical contact between an aperture of a panel member, also referred to as a sleeve or barrel, and legs 22, 24. The sleeve is a plated through-hole. The increased surface area provides improved electrical performance despite a decrease in radial interference between legs 22, 24 and the panel member aperture. Moreover, by virtue of the legs 22, 24 of insertion portion 14 being offset from the center 21 of slit 20, legs 22, 24 are disposed a lesser distance from end 28 of end portion 26. This shorter distance between the regions of contact of legs 22, 24 and the panel member aperture and end 28 similarly reduces the time frame to reflect electrical energy pulses that travel from the regions of contact of the legs toward end 28 before propagating back through the legs toward the beam portion 16 of electrical terminal 10 to the path of electrical connection. This reduction in reflection time frame improves electrical performance.

Figure 4:
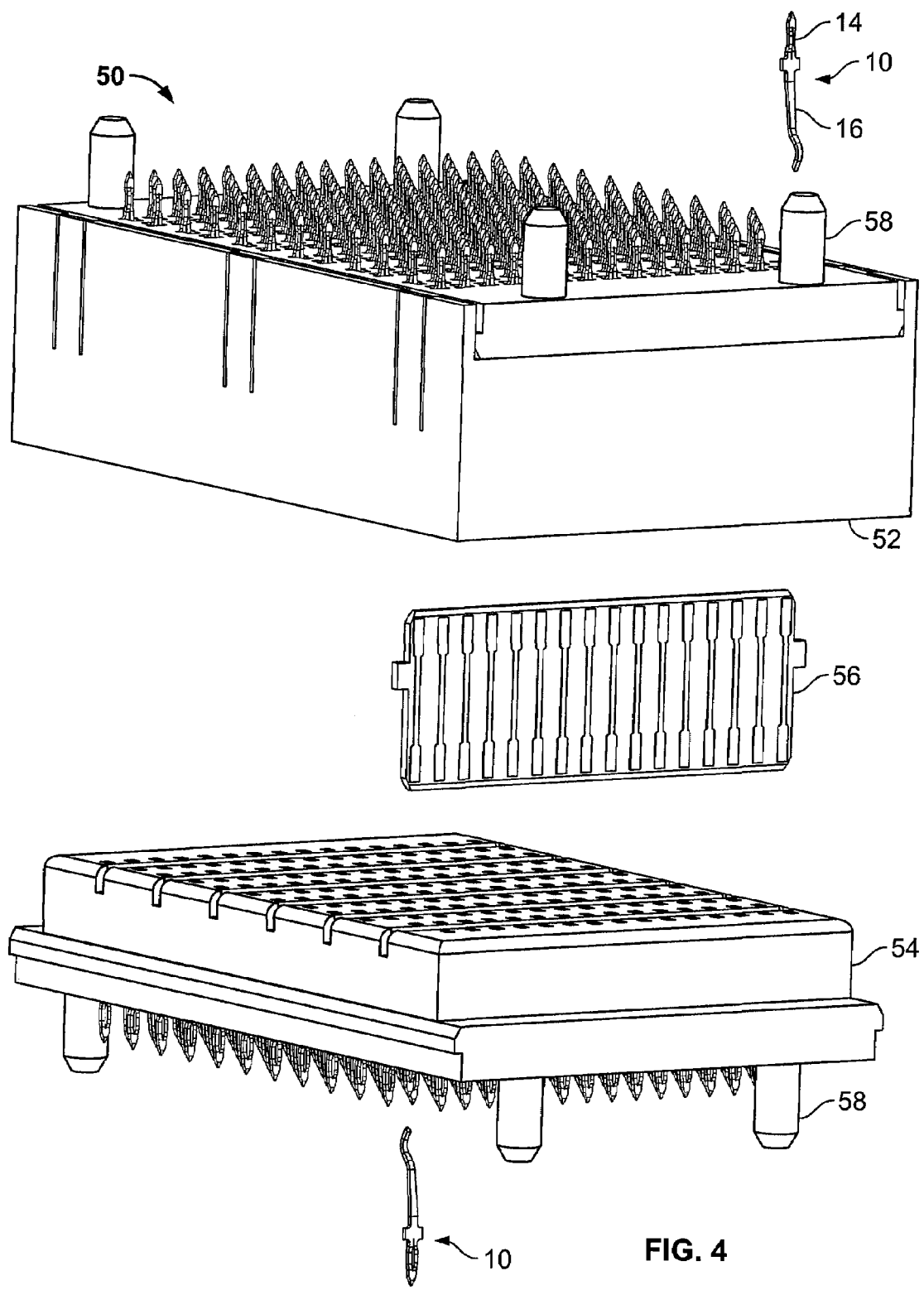
FIG. 4 is an exploded perspective view of a connector containing electrical terminals of the present invention.
Figure 5:
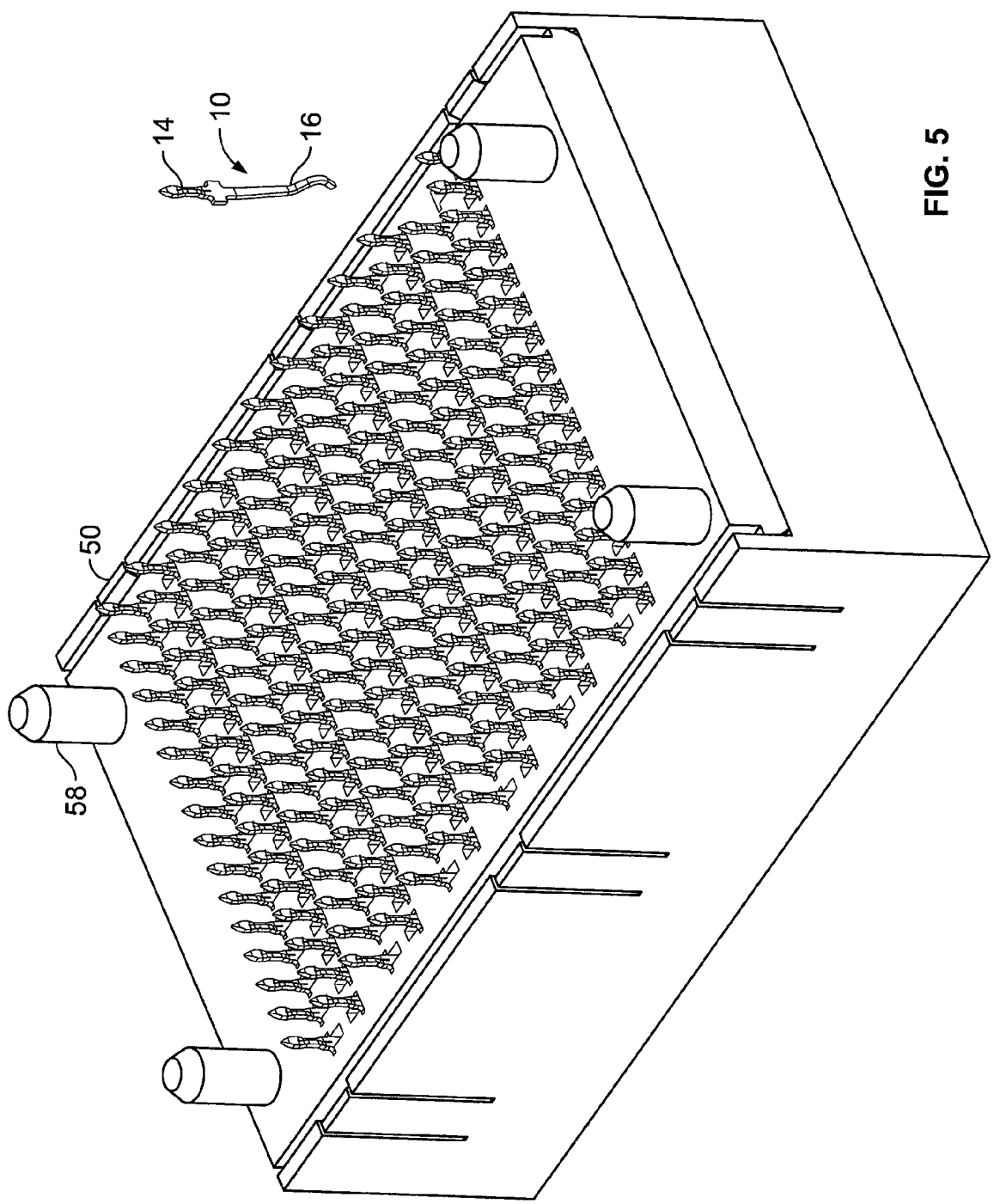
FIG. 5 is a perspective view of an assembled connector containing electrical terminals of the present invention.
Figure 6:
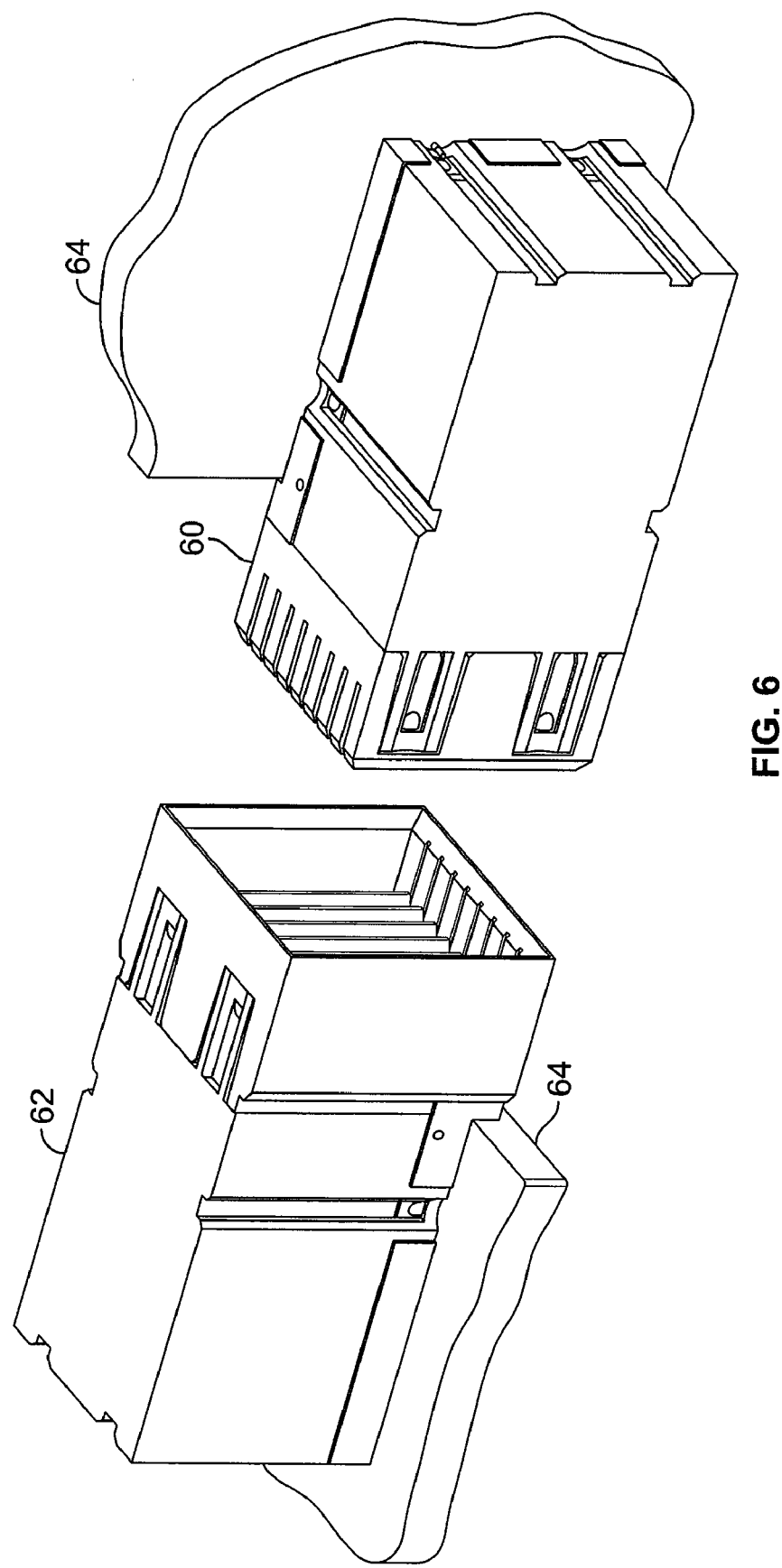
FIG. 6 is an enlarged partial perspective view of a pair of aligned mating connectors, each connector secured to a respective panel member of the present invention.

FIGS. 4-6 show connectors 50, 60, 62 that are usable with electrical terminal 10 of the present invention to connect panel members 64. Connector 50 includes a connector portion 52 that is configured to receive a plurality of electrical terminals 10. Preferably, connector portion 52 also includes a plurality, such as four, alignment pins 58 having corresponding apertures (not shown) to receive the alignment pins. Once the alignment pins 58 are received in the corresponding panel member apertures, alignment is also achieved between the electrical terminals and their corresponding apertures in the panel member. A connector portion 54 is also configured to receive a plurality of electrical terminals 10 and has a plurality of alignment pins 58. Connector portions 52, 54 are secured together to form connector 50 and further include a plurality of interconnecting members 56 installed prior to assembly of the connector portions to provide electrical connectivity between the electrical terminals in the connector portions. It is to be understood that connector 50 can be used to connect two panel members (not shown).

As shown in FIG. 6, connectors 60, 62 can be used to connect together respective panel members 64. That is, connectors 60, 62 each include at least one side similar to connector 50 so that each of the connectors is connected to a corresponding panel member 64. As further shown in FIG. 6, panel members 64 can be assembled substantially perpendicular to each other. However, it is to be understood that connectors 60, 62 can be configured so that the corresponding panel members 64 can be disposed end to end from each other or at any angle from each other.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An electrical terminal of the type to be inserted into an aperture of an electrical panel member comprising:
   a base;
   an insertion portion extending from the base to a first end;
   a slit formed through the insertion portion and extending from or between the base and the first end, the slit defining a slit midpoint and defining a compliant portion having a first leg and a second leg;
   a substantially central axis extending longitudinally between opposite ends of the slit, wherein a segment of the first leg is deformed in one direction away from the central axis, and a segment of the second leg is deformed in a direction away from the central axis opposite the first leg;
   wherein the deformed first leg segment comprises a first midpoint and the deformed second leg segment comprises a second midpoint, at least one of the first midpoint or the second midpoint being offset from the slit midpoint in a direction toward the base.

2. The terminal of claim 1 wherein the first and second legs each substantially define a substantially arcuate profile.

3. The terminal of claim 1 wherein the first and second legs each have a substantially rectangular cross section.

4. The terminal of claim 1 wherein the insertion portion is configured and disposed for insertion into an aperture of less than 0.016 inch.

5. The terminal of claim 1 wherein the compliant portion is tapered.

6. The terminal of claim 1 wherein the compliant portion is about 0.05 inch in length.

7. The terminal of claim 1 wherein the compliant portion is less than 0.05 inch in length.

8. The terminal of claim 1 wherein the first midpoint and the second midpoint lie within a plane that is substantially perpendicular to the central axis.

9. The terminal of claim 1 wherein the insertion portion has a shape adapted to require a substantially uniform insertion force over a substantial portion of a length of insertion of the insertion portion into the aperture.

10. The terminal of claim 1 wherein the terminal is used with connectors for connecting electrical panel members.

11. The terminal of claim 10 wherein the connectors form connections with adjacent panel members disposed at an angle to each other.

12. The terminal of claim 11 wherein the adjacent panel members are substantially perpendicular to each other.

13. An electrical terminal of the type to be inserted into an aperture of an electrical panel member comprising:
   a base;
   an insertion portion extending from the base to a first end;
   a slit formed through the insertion portion and extending from or between the base and the first end, the slit defining a slit midpoint and defining a compliant portion having a first leg and a second leg;
   a substantially central axis extending longitudinally between opposite ends of the slit, wherein a segment of the first leg is deformed in one direction away from the central axis, and a segment of the second leg is deformed in a direction away from the central axis opposite the first leg, the deformed first leg segment comprising a first midpoint and the deformed second leg segment comprising a second midpoint, at least one of the first midpoint or the second midpoint being offset from the slit midpoint in a direction toward the base;
   a first tapered segment adjacent the first end and a second tapered segment extending from the first tapered segment to the base; and
   wherein the insertion portion is configured for insertion into an aperture of less than 0.016 inch.

14. The terminal of claim 13 wherein the insertion portion has a shape adapted to require a substantially uniform insertion force over a substantial portion of a length of insertion of the insertion portion into the aperture.

* * * * *